United States Patent
Irving

(10) Patent No.: US 7,865,796 B2
(45) Date of Patent: Jan. 4, 2011

(54) METHOD AND SYSTEM FOR MEMORY PARTITIONING

(75) Inventor: Clive Russell Irving, Kingsbridge (GB)

(73) Assignee: Broadcom Corporation, Irvine, CA (US)

( * ) Notice: Subject to any disclaimer, the term of this patent is extended or adjusted under 35 U.S.C. 154(b) by 1030 days.

(21) Appl. No.: 11/526,335

(22) Filed: Sep. 25, 2006

(65) Prior Publication Data

US 2008/0092027 A1    Apr. 17, 2008

(51) Int. Cl.
*H03M 13/00* (2006.01)
(52) U.S. Cl. .................. 714/752; 714/758
(58) Field of Classification Search .......... 714/752, 714/703, 755; 341/81; 375/240.27
See application file for complete search history.

(56) References Cited

U.S. PATENT DOCUMENTS

| | | | | |
|---|---|---|---|---|
| 6,151,690 A | * | 11/2000 | Peeters | 714/701 |
| 6,363,026 B1 | * | 3/2002 | Su et al. | 365/230.01 |
| 6,546,509 B2 | * | 4/2003 | Starr | 714/704 |
| 7,408,999 B2 | * | 8/2008 | Xue et al. | 375/262 |
| 2006/0107170 A1 | * | 5/2006 | Deczky | 714/752 |

* cited by examiner

*Primary Examiner*—Sam Rizk
(74) *Attorney, Agent, or Firm*—McAndrews, Held & Malloy, Ltd.

(57) ABSTRACT

Systems and methods for interleaver and deinterleaver memory partitioning optimize data rate and error correction. Optimized memory allocation is important in systems that support bi-directional communication over multiple data paths. By using path-specific information such as impulse noise protection and data rate, memory may be dynamically partitioned to optimize the capacity in individual data paths.

27 Claims, 5 Drawing Sheets

US 7,865,796 B2

METHOD AND SYSTEM FOR MEMORY PARTITIONING

RELATED APPLICATIONS

[Not Applicable]

FEDERALLY SPONSORED RESEARCH OR DEVELOPMENT

[Not Applicable]

MICROFICHE/COPYRIGHT REFERENCE

[Not Applicable]

BACKGROUND OF THE INVENTION

Error correction techniques have been developed to counter the inevitable errors encountered over a non-ideal network. For example, forward error correction encoding may be combined with interleaving at the transmitter. At the receiver, the incoming signal is deintereleaved before being decoded. Thus, if corruption of signal due to impulse noise occurs between transmitter and receiver, the deinterleaver may spread the errors over time. Distributed errors may then be correctable by the decoder. The interleaver depth determines the degree of protection possible. In order to apply greater impulse noise protection, greater interleaver depth is required.

Interleavers and deinterleavers may temporarily store portions of a signal and output them in a different order from which they were input. The allocation of memory for each interleaver/deinterlaver directly affects the data rate and the error correction capability.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided for memory partitioning, substantially as shown in and/or described in connection with at least one of the figures, as set forth more completely in the claims. Advantages, aspects and novel features of the present invention, as well as details of an illustrated embodiment thereof, will be more fully understood from the following description and drawings.

DETAILED DESCRIPTION OF THE INVENTION

Aspects of the present invention relate to memory partitioning and more specifically, to partition control systems and methods for interleaving and deinterleaving. Although the following description may refer to particular communication standards, many other standards may also use these systems and methods.

Figure 1:
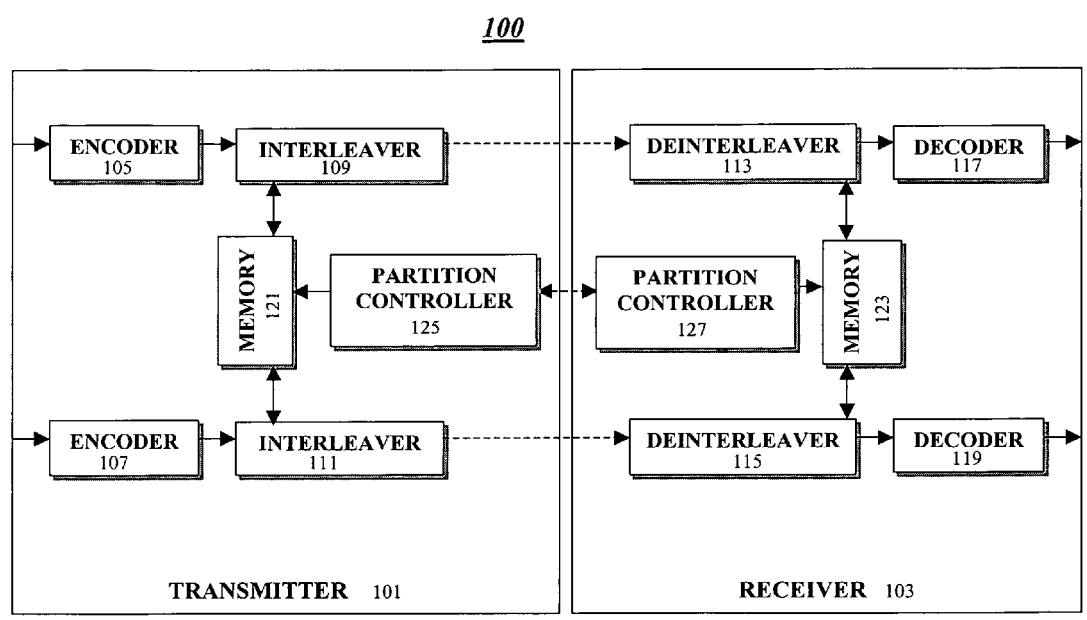
FIG. 1 is an illustration of an exemplary system for interleaver and deinterleaver memory partitioning in accordance with an embodiment of the present invention.

FIG. 1 is an illustration of an exemplary system 100 for interleaver and deinterleaver memory partitioning in accordance with an embodiment of the present invention. The system 100 comprises a transmitter 101 and a receiver 103. The transmitter 101 comprises encoders 105 and 107, interleavers 109 and 111, memory 121, and a partition controller 125. The receiver 103 comprises deinterleavers 113 and 115, decoders 117 and 119, memory 123, and a partition controller 127.

Before transmission, two or more data paths may be encoded. The encoder 105 and 107 may utilize forward error correction (FEC) such as Reed-Solomon (RS) coding, convolutional coding, or turbo coding. FEC may create parity bytes, which may be appended to the encoder output. Encoded data is then interleaved before transmission. The interleavers 109 and 111 are a mechanism for providing impulse noise protection (INP).

The interleaved data is deintereleaved and decoded in the receiver 103. In order to implement an interleaver or deinterleaver, it may be necessary to store data temporarily and output it in an order different from the input. This implies the need for memory 121 and 123. The amount of memory available may be fixed in some applications. The amount of memory required may be proportional to the data rate. Also, the amount of memory used may be proportional to the INP required.

It is desirable to split the pools of interleaver memory 121 and deinterleaver memory 123 in the most optimal manner so as to maximize the achievable data rate and to maximize the INP. If more memory than necessary is allocated to one path, the other path will not be able to achieve as high a data rate for the given INP.

The partition controller 125 in the transmitter 101 may compute, for each path, the product of the INP and the data rate. The interleaver memory 121 is then partitioned according to the ratios of these products. Certain min/max sizes may be set. The partition controller 125 in the transmitter 101 may also instruct the partition controller 127 in the receiver 103 to partition the deinterleaver memory 123 according to the ratios of these products.

Alternatively, the partition controller 127 in the receiver 103 may compute, for each path, the product of the INP and the data rate. The deinterleaver memory 123 is then partitioned according to the ratios of these products. Certain min/max sizes may be set. The partition controller 127 in the receiver 103 may also instruct the partition controller 125 in the transmitter 101 to partition the interleaver memory 121 according to the ratios of these products.

Figure 2:
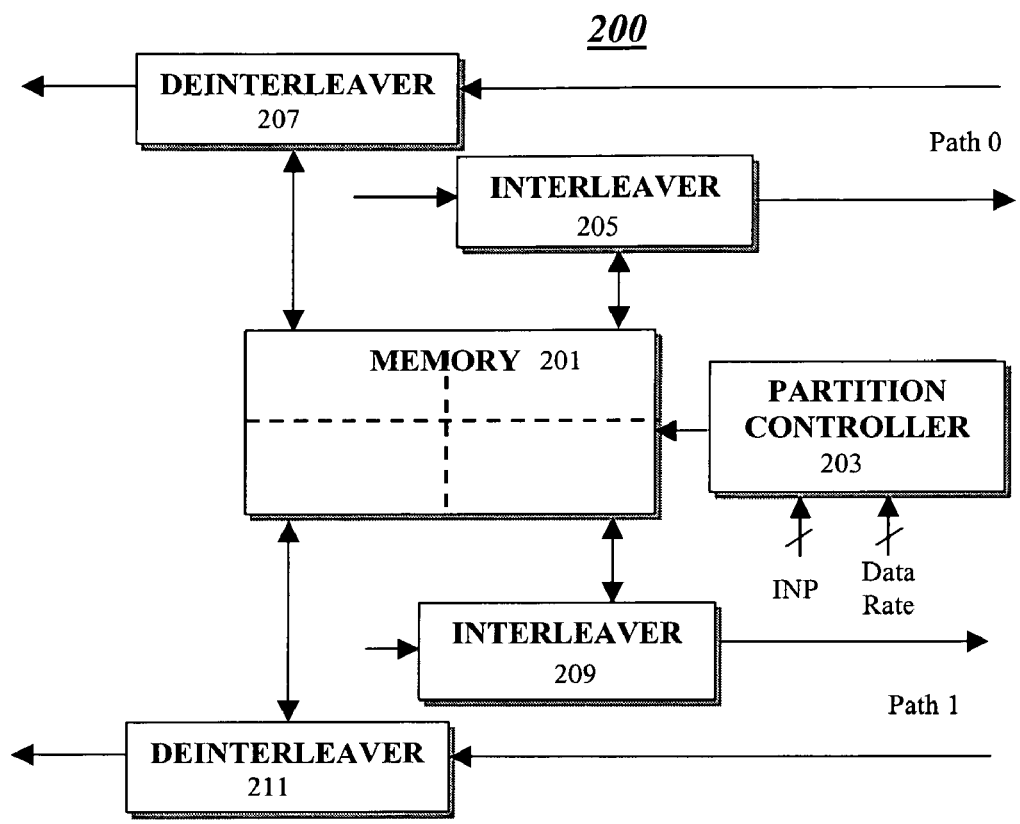
FIG. 2 is an alternative illustration of an exemplary system for interleaver and deinterleaver memory partitioning in accordance with an embodiment of the present invention.

FIG. 2 is another illustration of an exemplary system 200 for interleaver and deinterleaver memory partitioning in accordance with an embodiment of the present invention. A single device comprises a plurality of interleavers 205 and 209, a plurality of deinterleavers 207 and 211, a shared memory 201, and a partition controller 203. The partition controller 203 receives the INP and data rate for each communication path and each communication direction. These parameters may differ. The amount of memory allocated to an interleaver or deinterleaver in a particular communication path and direction is proportional to the relative value of the product of the INP and the data rate associated with the particular communication path and direction.

The aforementioned embodiment may exist when, for example, a master device, having a transmitter and a receiver, communicates with a slave device. The master transmits to the slave in the downstream direction. The slave transmits to the master in the upstream direction. The master device may optimize memory allocation in all paths and both directions. The slave device may then adhere to the partitioning generated by the master.

Figure 3:
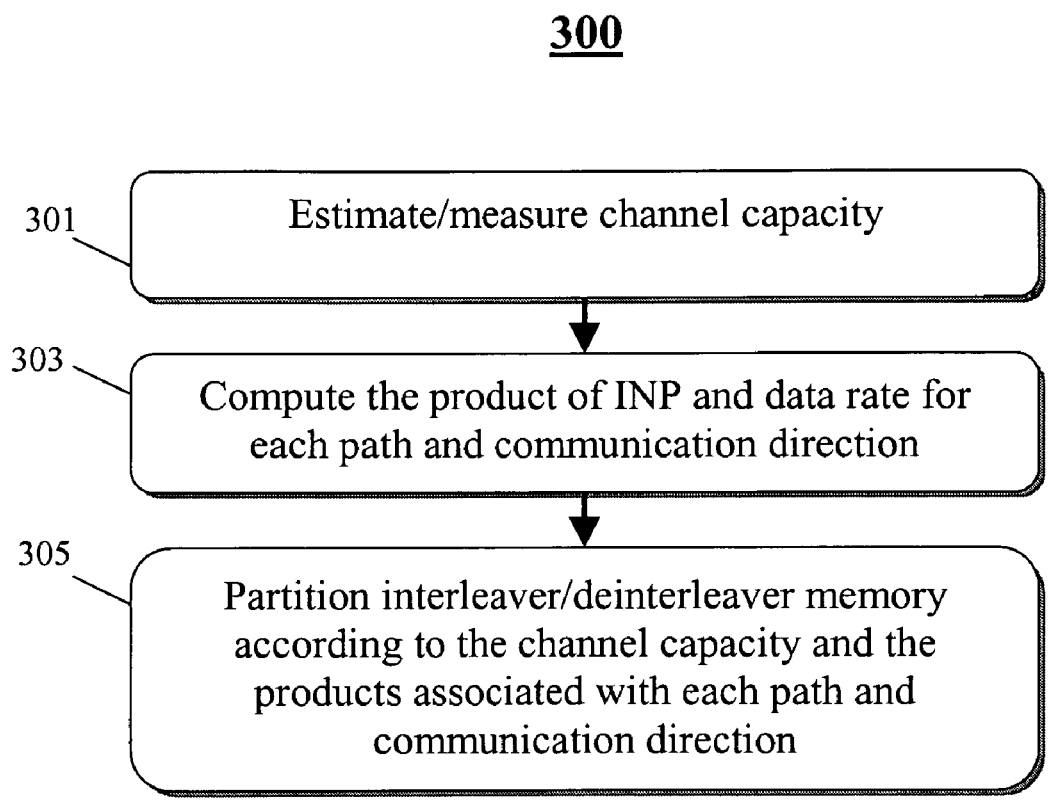
FIG. 3 is a flowchart illustrating an exemplary method for interleaver and deinterleaver memory partitioning in accordance with a representative embodiment of the present invention.

FIG. 3 is a flowchart illustrating an exemplary method for interleaver and deinterleaver memory partitioning in accordance with a representative embodiment of the present invention. At 301 the channel capacity is either measured or estimated. The downstream capacity may be measured during training in order to compute the product of INP and data rate. This downstream capacity measurement may be reported in a training message. Alternatively, the capacity of the downstream direction may be estimated based knowledge of the upstream channel or by some other unspecified means.

The product of INP and data rate for a plurality of paths and communication directions is computed at 303. The data rate used in this product can be limited by the desired max/min rates and/or the determined channel capacity. At 305, interleaver and/or deinterleaver memory is then partitioned according to the channel capacity and the products associated with each path and communication direction.

Figure 4:
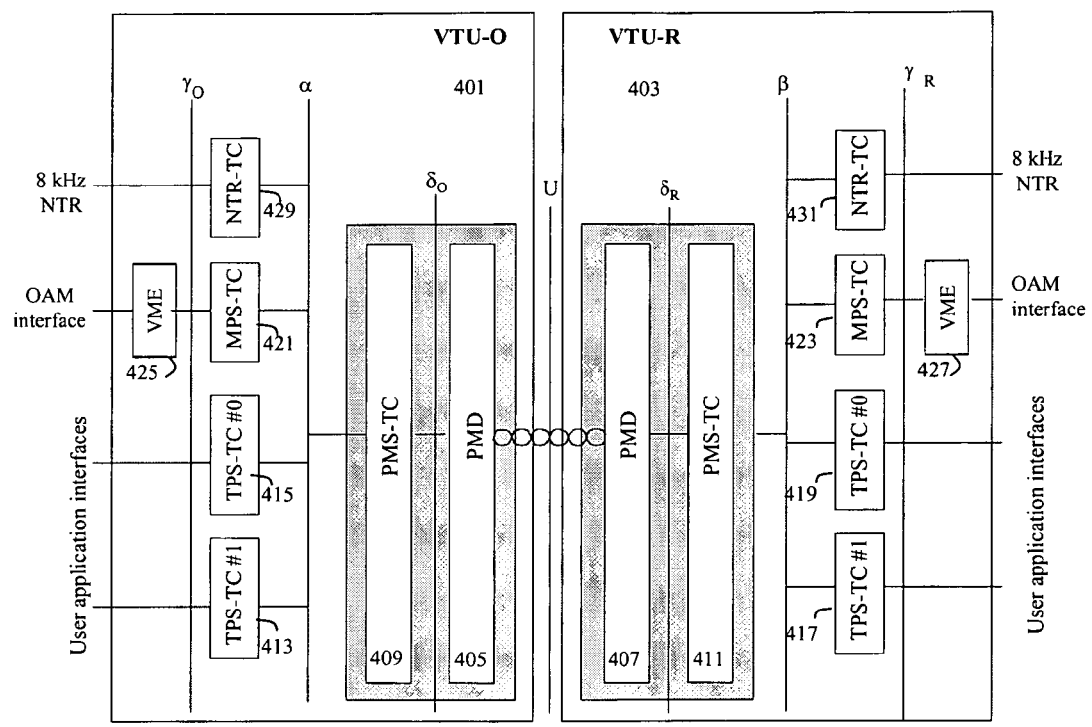
FIG. 4 is a functional model of VDSL2 in accordance with an embodiment of the present invention.

FIG. 4 is a functional model of VDSL2 in accordance with an embodiment of the present invention. G.993.2 VDSL2 (Very high speed Digital Subscriber Line Transceivers 2) is an access technology that exploits the existing infrastructure of copper wires that were originally deployed for telephone services. It can be deployed from central offices, from fiber-fed cabinets located near the customer premises, or within buildings. G.993.2 supports asymmetric and symmetric transmission at a bi-directional net data rate up to 200 Mbit/s on twisted pairs using a bandwidth up to 30 MHz.

VDSL2 comprises VTU-O (central office, CO) 401 and VTU-R (customer premises equipment, CPE) 403. Each VTU-x 401 and 403 has an application-invariant section and an application-specific section. The physical medium dependent (PMD) sub-layer 405 and 407 and the physical media specific transmission convergence (PMS-TC) sub-layer 409 and 411 are part of the application-invariant section.

The application-specific parts are related to the user plane and include the transport protocol specific transmission convergence (TPS-TC) sub-layer 413, 415, 417, and 419; the management protocol specific transmission convergence (MPS-TC) sub-layer 21 and 423; the VDSL2 management entity (VME) 425 and 427; and the 8 kHz network timing reference transmission convergence (NTR-TC) sub-layer 429 and 431.

The principal functions of the PMD 405 and 407 are symbol timing generation and recovery, encoding and decoding, and modulation and demodulation. The PMD may also include echo cancellation and line equalization. The PMD may also contain a degree of forward error correction (FEC) trellis encoding and decoding.

The PMS-TC 409 and 411 contains framing and frame synchronization functions, as well as forward error correction (FEC), error detection, interleaving and de-interleaving, scrambling and descrambling functions. Additionally, the PMS-TC 409 and 411 provides an overhead channel that is used to transport management data. The PMS-TC 409 and 411 is connected to the PMD 405 and 407 across the δ interface, and is connected to the TPS-TC 413, 415, 417, and 419 across α and β interfaces in the VTU-O 401 and the VTU-R 403, respectively.

The TPS-TC 413, 415, 417, and 419 is application specific and is mainly intended to convert applicable data transport protocols into the unified format required at the α and β interfaces and to provide bit rate adaptation between the user data and the data link established by the VTU. Depending on the specific application, the TPS-TC 413, 415, 417, and 419 may support one or more channels of user data. The TPS-TC 413, 415, 417, and 419 communicates with the user data interface blocks at the VTU-R 401 and VTU-O 403 across the $\gamma_R$ and $\gamma_O$ interfaces, respectively. The MPS-TC 421 and 423 and NTR-TC 429 and 431 provide TPS-TC functions for management data and 8 kHz NTR signals, respectively.

The VME 425 and 427 facilitates the management of the VTU. It communicates with higher management layer functions in the management plane as described in ITU-T Recommendation G.997.1. Management information is exchanged between the VME functions of the VTU-O and VTU-R through the overhead channel provided by the PMS-TC. The MPS-TC converts the incoming management data into the unified format required at the α and β interfaces to be multiplexed into the PMS-TC. The management information contains indications of anomalies and defects, and related performance monitoring counters, and management command/response messages facilitating procedures defined for use by higher layer functions, specifically for testing purposes.

Figure 5:
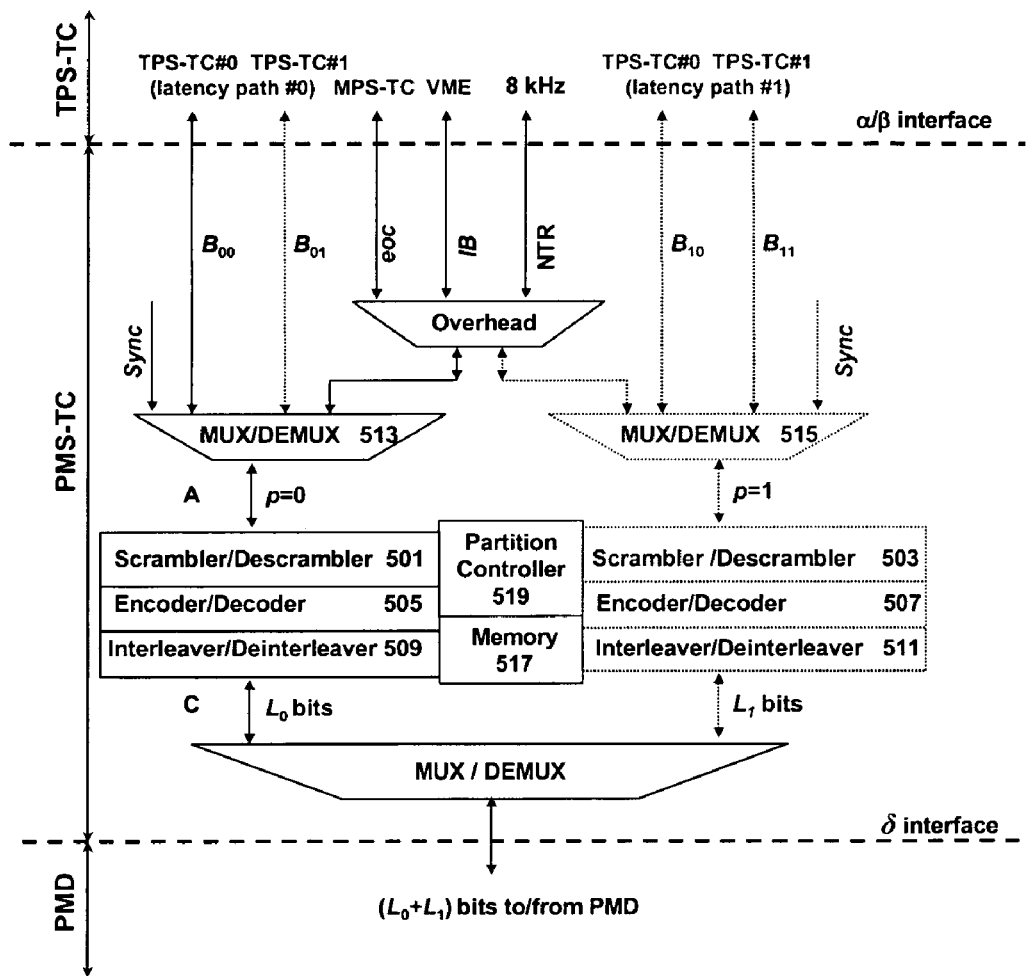
FIG. 5 is an illustration of the VDSL2 PMS-TC sublayer in accordance with an embodiment of the present invention.

FIG. 5 is an illustration of the VDSL2 PMS-TC sublayer functional model in accordance with an embodiment of the present invention. The PMS-TC resides between the α/β interface and δ interface of the VDSL2 transceiver reference model in FIG. 4. The PMS-TC comprises scramblers/descramblers 501 and 503, forward error correction (FEC) encoders/decoders 505 and 507, interleavers/deinterleavers 509 and 511, Multiplex/Demultiplex circuits 513 and 515, memory 517, and a partition controller 519.

Up to two bearer channels of transmit user data originated by various TPS-TCs, management data originated by the MPS-TC, and NTR data are incoming via the α/β interface in a uniform format. The incoming user data and the overhead data are multiplexed into one or two latency paths. Each bearer channel is carried over a single latency path (i.e., shall not be split across 2 latency paths). A Syncbyte is added to each latency path for overhead (OH) frame alignment.

Two or more applications with different data rate and INP requirements may be transported simultaneously. A VTU may implement dual latency to improved performance and/or quality of service. The multiplexed 513 and 515 data in each latency path is scrambled 501 and 503, encoded using Reed-Solomon forward error correction coding 505 and 507, and interleaved 509 and 511. The interleaved buffers of data in both latency paths are multiplexed into a bit stream to be submitted to the PMD via the δ interface.

In the downstream direction a VTU-O transmits and a VTU-R receives. In the upstream direction a VTU-R transmits and a VTU-O receives.

When the PMS-TC transmits, the multiplexed 513 and 515 data in each latency path is scrambled 501 and 503, encoded using Reed-Solomon forward error correction coding 505 and 507, and interleaved 509 and 511. The interleaved buffers of data of both latency paths are multiplexed into a bit stream to be submitted to the PMD via the δ interface.

When the PMS-TC receives, the interleaved buffers of data of both latency paths are demultiplexed from the δ interface.

The data in each latency path is deinterleaved 509 and 511, decoded 505 and 507, and descrambled 501 and 503.

The VDSL2 standard, ITU G.993.2, specifies a common pool of interleaver memory 517 that can be partitioned 519 between upstream and downstream directions and between multiple channel bearers.

Interleaving may be provided in all supported latency paths to protect the data against bursts of errors by spreading the errors over a number of Reed-Solomon codewords. The interleaver depth may be set to meet the requirements for error-burst protection and latency.

In the context of VDSL2, INP is defined as the number of DMT symbols of complete corruption that could still be error-corrected with the particular set of selected parameters. The time span of impulse noise protection, in ms, varies with sub-carrier spacing. For example, the DMT symbol length may be 0.25 ms or 0.125 ms.

$INP_p$ (impulse noise protection for latency path p) is defined as the number of consecutive Discrete Multitone (DMT) symbols or fractions thereof, as seen at the input to the de-interleaver, for which errors can be completely corrected by the error correcting code, regardless of the number of errors within the DMT symbols in error.

The actual impulse noise protection $INP\_act_n$ of bearer channel #n may be set to the value of the derived parameter $INP_p$ of the underlying PMS-TC path function. During initialisation, the VTUs may have selected the framing parameters (interleaver codeword size, RS codeword size, number of RS parity bytes per codeword, interleaving depth, etc) to achieve the requested INP_min values. The receiver may ensure $INP\_act_n \geq INP\_min_n$ according to the definition of $INP_p$ regardless of any vendor-discretionary techniques including, for example, the use of erasure decoding.

In VDSL2, the interleaver is a mechanism for providing protection against impulse noise events. Before transmission, blocks of bytes are Reed-Solomon (RS) encoded, the resulting parity bytes being appended. Multiple blocks are then interleaved before transmission.

In order to implement an interleaver or deinterleaver, it may be necessary to store bytes from RS codewords, outputting them in a different order to which they were input. This implies the need for memory. The VDSL2 standard mandates that either 32 kbytes or 48 kbytes of interleaver memory shall be available at each VTU-x (depending on the performance profile required). The memory used is roughly proportional to the product of data rate and INP, for a given set of RS codeword size and number of RS parity bytes.

The VTU-O (central office, CO) dictates to the VTU-R (customer premises equipment, CPE) the maximum amount of interleaver memory for the downstream direction and how the memory shall be divided between bearer channels. VDSL2 supports two independent bearers.

It is desirable to split the pool of interleaver memory in the most optimal manner so as to maximize the achievable bit rate and to maximize the impulse noise protection. If more memory than necessary is allocated to one bearer/direction then the other bearers/direction will not be able to achieve as high a rate for the given INP required.

The CO may compute, for each direction and bearer, the product of the requested INP and the achievable bit rate (or demanded bit rate, if this is less). The interleaver memory pool should then be split according to the ratios of these products (perhaps with clamping to a certain min/max value if a certain implementation requires a minimum amount of memory for its interleaver/deinterleaver implementation, regardless of the actual desired INP).

Optimum VDSL2 upstream and downstream bearer bit rates may be achieved when the raw capacity of the channel is not the limiting factor, i.e. where the INP requirement and the finite amount of interleaver memory, the bit rates cause the limit.

During training, the CO would ideally make use of a measure of the downstream capacity—in order to compute the product of INP and bit rate. The training messages from the CPE may be extended to report a measure of downstream capacity.

The present invention may be realized in hardware, software, or a combination of hardware and software. The present invention may be realized in a centralized fashion in an integrated circuit or in a distributed fashion where different elements are spread across several circuits. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A system for memory partitioning, wherein the system comprises:
   a first interleaver for interleaving a first signal, wherein the first signal is associated with a first impulse noise protection parameter and a first data rate;
   a second interleaver for interleaving a second signal, wherein the second signal is associated with a second impulse noise protection parameter and a second data rate;
   a circuit for computing a partition metric according to the first impulse noise protection parameter, the first data rate, the second impulse noise protection parameter, and the second data rate; and
   a memory, wherein the first interleaver accesses a first portion of the memory according to the partition metric and the second interleaver accesses a second portion of the memory according to the partition metric.

2. The system of claim 1, wherein the partition metric is based on the product of first impulse noise protection parameter and the first data rate, and the product of the second impulse noise protection parameter and the second data rate.

3. The system of claim 1, wherein the partition metric is based on the ratio of products associated with the first signal and the second signal.

4. The system of claim 1, wherein the partition metric is based on channel capacity.

5. The system of claim 4, wherein the channel capacity is measured during a training period.

6. The system of claim 4, wherein the channel capacity in a downstream direction is estimated according to an upstream channel capacity.

7. The system of claim 4, wherein the first signal and the second signal are transported according to VDSL2.

8. A system for memory partitioning, wherein the system comprises:
- a first deinterleaver for deinterleaving a first signal, wherein the first signal is associated with a first impulse noise protection parameter and a first data rate;
- a second deinterleaver for deinterleaving a second signal, wherein the second signal is associated with a second impulse noise protection parameter and a second data rate;
- a circuit for computing a partition metric according to the first impulse noise protection parameter, the first data rate, the second impulse noise protection parameter, and the second data rate; and
- a memory, wherein the first deinterleaver accesses a first portion of the memory according to the partition metric and the second deinterleaver accesses a second portion of the memory according to the partition metric.

9. The system of claim 8, wherein the partition metric is based on the product of first impulse noise protection parameter and the first data rate, and the product of the second impulse noise protection parameter and the second data rate.

10. The system of claim 8, wherein the partition metric is based on the ratio of products associated with the first signal and the second signal.

11. The system of claim 8, wherein the partition metric is based on channel capacity.

12. The system of claim 11, wherein the channel capacity is measured during a training period.

13. The system of claim 11, wherein the channel capacity in a downstream direction is estimated according to an upstream channel capacity.

14. The system of claim 8, wherein the first signal and the second signal are transported according to VDSL2.

15. A system for memory partitioning, wherein the system comprises:
- an interleaver for interleaving a first signal, wherein the first signal is associated with a first impulse noise protection parameter and a first data rate;
- a deinterleaver for deinterleaving a second signal, wherein the second signal is associated with a second impulse noise protection parameter and a second data rate;
- a circuit for computing a partition metric according to the first impulse noise protection parameter, the first data rate, the second impulse noise protection parameter, and the second data rate; and
- a memory, wherein the interleaver accesses a first portion of the memory according to the partition metric and the deinterleaver accesses a second portion of the memory according to the partition metric.

16. The system of claim 15, wherein the partition metric is based on the product of first impulse noise protection parameter and the first data rate, and the product of the second impulse noise protection parameter and the second data rate.

17. The system of claim 15, wherein the partition metric is based on the ratio of products associated with the first signal and the second signal.

18. The system of claim 15, wherein the partition metric is based on channel capacity.

19. The system of claim 18, wherein the channel capacity is measured during a training period.

20. The system of claim 18, wherein the channel capacity in a downstream direction is estimated according to an upstream channel capacity.

21. The system of claim 15, wherein the first signal and the second signal are transported according to VDSL2.

22. A method for memory partitioning, wherein the method comprises:
- generating corresponding product of impulse noise protection and data rate associated with each of a plurality of data paths; and
- partitioning memory according to the corresponding product associated with each of the plurality of data paths, wherein a first interleaver and one of a second interleaver and a deinterleaver are allocated portions of the memory.

23. The method of claim 22, wherein for each of the plurality of data paths, one or both of the first interleaver and second interleaver is allocated a portion of the memory, wherein a relative size of the allocated memory portion is based on the corresponding product of the impulse noise protection and data rate.

24. The method of claim 22, wherein for each of the plurality of data paths, the deinterleaver is allocated a memory portion, wherein a relative size of the memory portion is based on the corresponding product of impulse noise protection and data rate.

25. The method of claim 22, wherein the partitioning is based on channel capacity.

26. The method of claim 25, wherein the channel capacity is measured during training.

27. The method of claim 25, wherein the channel capacity is estimated according to another channel capacity in another communication direction.

* * * * *